US012563999B2

(12) United States Patent
    Takahashi

(10) Patent No.: US 12,563,999 B2
(45) Date of Patent: Feb. 24, 2026

(54) MANUFACTURING APPARATUS AND MANUFACTURING METHOD OF SEMICONDUCTOR DEVICE

(71) Applicant: Yamaha Robotics Co., Ltd., Tokyo (JP)

(72) Inventor: Makoto Takahashi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 822 days.

(21) Appl. No.: 17/626,810

(22) PCT Filed: Aug. 7, 2020

(86) PCT No.: PCT/JP2020/030434
§ 371 (c)(1),
(2) Date: Jan. 12, 2022

(87) PCT Pub. No.: WO2022/030006
PCT Pub. Date: Feb. 10, 2022

(65) Prior Publication Data
US 2022/0359240 A1    Nov. 10, 2022

(51) Int. Cl.
    *H01L 21/67* (2006.01)
    *H01L 21/60* (2006.01)
(52) U.S. Cl.
    CPC ........ *H01L 21/67144* (2013.01); *H01L 21/60* (2021.08); *H01L 21/67092* (2013.01);
    (Continued)
(58) Field of Classification Search
    None
    See application file for complete search history.

(56) References Cited

U.S. PATENT DOCUMENTS

2009/0289098 A1    11/2009   Terada et al.
2016/0336291 A1    11/2016   Miura
2023/0230853 A1*    7/2023   Tani ........................ H01L 21/50
                                                        438/106

FOREIGN PATENT DOCUMENTS

CN          106158700        11/2016
JP          H0521529         1/1993
            (Continued)

OTHER PUBLICATIONS

"International Search Report (Form PCT/ISA/210) of PCT/JP2020/030434," mailed on Sep. 29, 2020, pp. 1-3.
(Continued)

*Primary Examiner* — Long Pham
(74) *Attorney, Agent, or Firm* — JCIPRNET

(57) ABSTRACT

A manufacturing apparatus of a semiconductor device includes: a stage; a bonding head, including a mounting tool, a tool heater, and a lifting and lowering mechanism; and a controller performing bonding processing. The controller performs, in the bonding processing: first processing in which, after a chip is brought into contact with a substrate, as heating of the chip is started, the chip is pressurized against the substrate; distortion elimination processing in which, after the first processing and before melting of a bump, the lifting and lowering mechanism is driven in a lifting direction, thereby eliminating distortion of the bonding head; and second processing in which, after the distortion elimination processing, position control is performed on the lifting and lowering mechanism so as to cancel thermal expansion and contraction of the bonding head, thereby maintaining a gap amount at a specified target value.

2 Claims, 12 Drawing Sheets

(52) U.S. Cl.
CPC .. *H01L 21/67103* (2013.01); *H01L 21/67259*
(2013.01); *H01L 2021/6003* (2013.01); *H01L*
*2021/6015* (2013.01); *H01L 2021/60172*
(2013.01); *H01L 2021/60232* (2013.01)

(56)                References Cited

FOREIGN PATENT DOCUMENTS

| | | |
|---|---|---|
| JP | H09153522 | 6/1997 |
| JP | H09153525 | 6/1997 |
| JP | H11145196 | 5/1999 |
| JP | 2012094725 | 5/2012 |
| JP | 5014151 | 8/2012 |
| JP | 2016213384 | 12/2016 |
| JP | 2017034282 | 2/2017 |
| WO | 2012057009 | 5/2012 |

OTHER PUBLICATIONS

"Office Action of Taiwan Counterpart Application", issued on Aug. 24, 2022, with partial English translation thereof, pp. 1-8.
"Written Opinion of the International Searching Authority (Form PCT/ISA/237) of PCT/JP2020/030434", mailed on Sep. 29, 2020, with English translation thereof, pp. 1-8.
"Office Action of China Counterpart Application", issued on Aug. 29, 2025, with English translation thereof, p. 1-p. 16.
"Office Action of Singapore Counterpart Application", issued on Sep. 13, 2025, p. 1-p. 5.

* cited by examiner

MANUFACTURING APPARATUS AND MANUFACTURING METHOD OF SEMICONDUCTOR DEVICE

CROSS-REFERENCE TO RELATED APPLICATION

This application is a 371 application of the International PCT application Ser. No. PCT/JP2020/030434, filed on Aug. 7, 2020. The entirety of the above-mentioned patent application is hereby incorporated by reference herein and made a part of this specification.

TECHNICAL FIELD

The present specification discloses a manufacturing apparatus and a manufacturing method for manufacturing a semiconductor device by bonding a chip held by a mounting tool to a substrate.

RELATED ART

Conventionally, a flip chip bonder has been known as a technique for mounting a chip on a substrate. In the flip chip bonder, a bump electrode called a bump is formed on a bottom surface of the chip. By a mounting tool, as the chip is pressed against the substrate, the chip is heated to melt the bump, and the bump of the chip is joined (that is, bonded) to an electrode of the substrate.

Patent Document 1 discloses such a flip chip bonder technique. In Patent Document 1, after a chip is brought into contact with a substrate by a mounting tool, the chip is heated to melt the bump while being pressurized with a constant load. In Patent Document 1, if the bump is melted, the mounting tool is lifted, then a heater is turned off to cure the bump, so that a gap amount between the bottom surface of the chip and the substrate has a desired value.

PRIOR ART DOCUMENTS

Patent Documents

Patent Document 1: Japanese Patent No. 5014151

SUMMARY OF THE INVENTION

Problems to be Solved by the Invention

However, in Patent Document 1, the chip is continuously pressurized with the constant load until the bump is completely melted. In this case, immediately after the bump is melted, a tip of the mounting tool is greatly lowered, and there is a risk that the molten bump may be greatly crushed. Particularly, in the case where the chip is normally pressurized with the constant load, the mounting tool is slightly distorted. When the bump is melted and a reaction force acting on the mounting tool from the chip decreases, this distortion is instantly eliminated, and the tip of the mounting tool moves in a direction of pressing and crushing the molten bump. As a result, the molten bump may be crushed more than expected. In this case, there is also a risk that the pressed and crushed bump may extend in a plane direction and a short circuit failure may be caused between the pressed and crushed bump and its adjacent bump.

That is, in the conventional art, there is a risk that a short circuit failure may occur, and quality of a semiconductor device cannot be appropriately maintained. Thus, the present specification discloses a manufacturing apparatus and a manufacturing method of a semiconductor device, in which the quality of the semiconductor device can be appropriately maintained.

Means for Solving the Problems

A manufacturing apparatus of a semiconductor device disclosed in the present specification is characterized as follows. The manufacturing apparatus includes: a stage, supporting a substrate; a bonding head, including a mounting tool that holds a chip provided with a bump on a bottom surface thereof, a tool heater that is mounted on the mounting tool in order to heat the chip, and a lifting and lowering mechanism that moves the mounting tool in a vertical direction; and a controller, controlling driving of the bonding head and performing bonding processing for bonding the chip to the substrate. The controller performs, in the bonding processing: first processing in which, after the chip is brought into contact with the substrate, the tool heater and the lifting and lowering mechanism are driven, and as heating of the chip is started, the chip is pressurized against the substrate; distortion elimination processing in which, after the first processing and before melting of the bump, the lifting and lowering mechanism is driven in a lifting direction, thereby eliminating distortion of the bonding head; and second processing in which, after the distortion elimination processing, position control is performed on the lifting and lowering mechanism so as to cancel thermal expansion and contraction of the bonding head, thereby maintaining a gap amount between the bottom surface of the chip and an upper surface of the substrate at a specified target value.

In this case, the controller may perform distortion elimination amount detection processing prior to the bonding processing. In the distortion elimination amount detection processing, while the mounting tool and the stage are maintained at a predetermined temperature, after the lifting and lowering mechanism is driven and the substrate is pressed by the mounting tool, a pressing load on the substrate by the mounting tool may be detected while the lifting and lowering mechanism is driven in the lifting direction, and a movement amount of the lifting and lowering mechanism from start of the driving in the lifting direction until stop of fluctuation of the pressing load may be stored as a distortion elimination amount. In the distortion elimination processing, the lifting and lowering mechanism may be driven in the lifting direction based on the distortion elimination amount.

The controller may perform melting timing detection processing in which a melting timing of the bump is detected prior to bonding of the chip to the substrate. In the melting timing detection processing, after the chip is brought into contact with the substrate, the chip may be heated according to a specified temperature profile, and time from start of the heating until melting of the bump may be stored as a melting time. The controller may determine an execution timing of the distortion elimination processing based on the melting time.

The lifting and lowering mechanism may include a slide shaft that is mechanically connected to the mounting tool, a drive source that lifts and lowers the slide shaft, and a position sensor that detects an axial position of the slide shaft as a detected position. The controller may perform target profile generation processing prior to the bonding processing. In the target profile generation processing, after the lifting and lowering mechanism is driven and the mounting tool is brought into contact with the substrate, the mounting tool may be heated according to a specified temperature profile. Based on a change in the detected position detected by the position sensor as obtained at that time, a thermal expansion amount of the bonding head may be acquired, and a movement profile in which the thermal expansion amount is canceled may be generated as a target profile. In the second processing, position control may be performed on the lifting and lowering mechanism according to the target profile.

A manufacturing method of a semiconductor device disclosed in the present specification is as follows. A bonding head including a mounting tool, a tool heater that is mounted on the mounting tool, and a lifting and lowering mechanism that moves the mounting tool in a vertical direction is driven, and a chip held by the mounting tool is bonded to a substrate supported on a stage. The manufacturing method of a semiconductor device is characterized by including: a first step in which, after the mounting tool is lowered and the chip is brought into contact with the substrate, the tool heater and the lifting and lowering mechanism are driven, and as heating of the chip is started, the chip is pressurized against the substrate; a distortion elimination step in which, after the first step and before melting of a bump provided on a bottom surface of the chip, the lifting and lowering mechanism is driven in a lifting direction, thereby eliminating distortion of the bonding head; and a second step in which, after the distortion elimination step, position control is performed on the lifting and lowering mechanism so as to cancel thermal expansion and contraction of the bonding head, thereby maintaining a gap amount between the bottom surface of the chip and an upper surface of the substrate at a specified target value.

Effects of the Invention

According to the technique disclosed in the present specification, distortion of the bonding head is eliminated before melting of the bump, and after that, the lifting and lowering mechanism is controlled so as to cancel thermal expansion and contraction of the bonding head. Accordingly, since the molten bump is prevented from being excessively pressed and crushed, the quality of the semiconductor device can be appropriately maintained.

DESCRIPTION OF THE EMBODIMENTS

Figure 1:
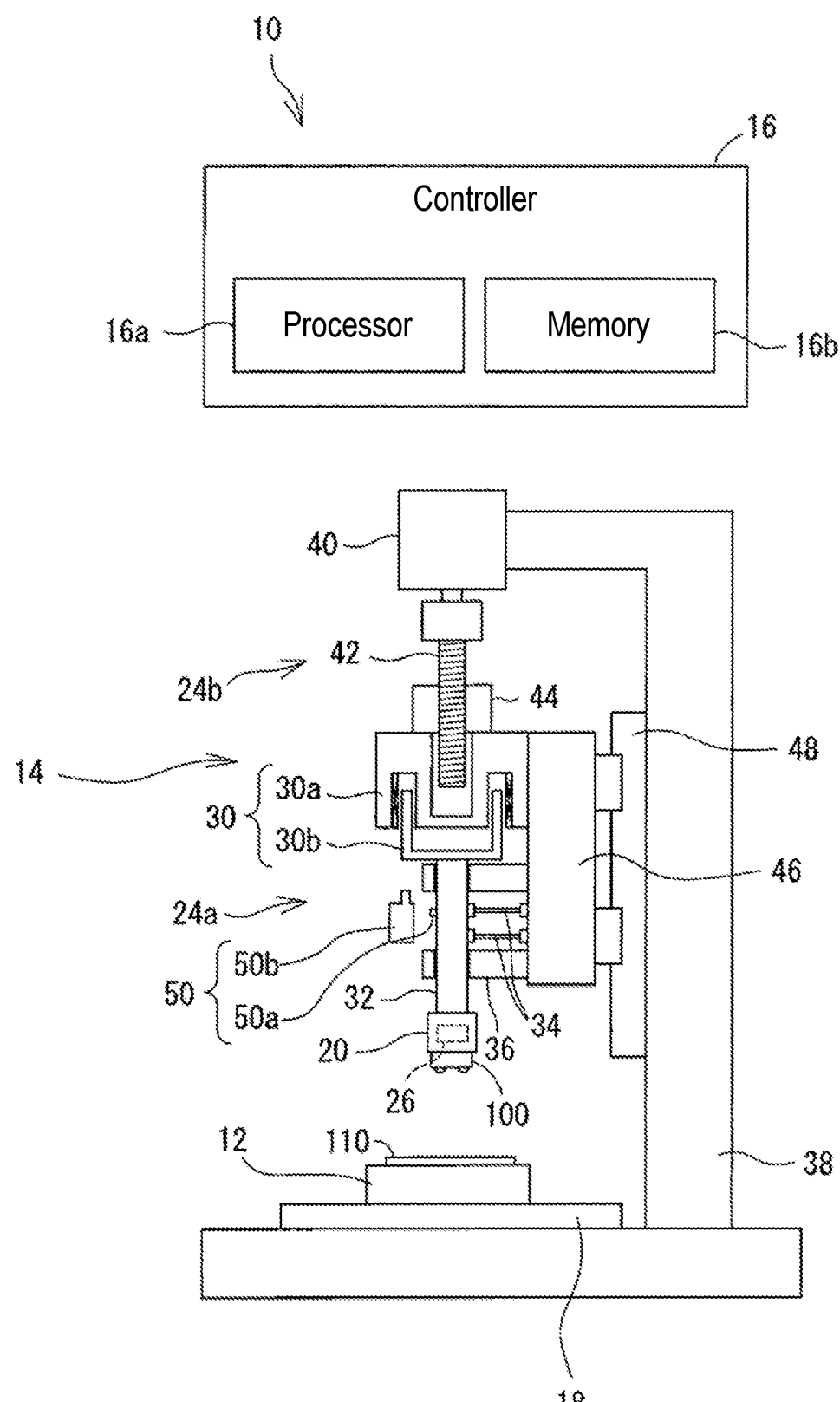
FIG. 1 is a conceptual diagram showing a configuration of a manufacturing apparatus of a semiconductor device.

Hereinafter, a manufacturing apparatus 10 of a semiconductor device is described with reference to the drawings. FIG. 1 is a conceptual diagram showing a configuration of the manufacturing apparatus 10 of a semiconductor device. The manufacturing apparatus 10 is an apparatus for manufacturing a semiconductor device by mounting a semiconductor chip 100 being an electronic component on a substrate 110 in a face-down state. The manufacturing apparatus 10 includes: a bonding head 14 including a mounting tool 20, a chip supply means (not shown) supplying the semiconductor chip 100 to the mounting tool 20, a stage 12 supporting the substrate 110, an XY stage 18 moving the stage 12 in an XY direction (horizontal direction), and a controller 16 controlling driving of the above, and the like.

The substrate 110 is suctioned and held by the stage 12, and is heated by a stage heater (not shown) provided on the stage 12. The semiconductor chip 100 is supplied to the mounting tool 20 by the chip supply means. There are various possible configurations of the chip supply means. For example, a configuration is conceivable in which a semiconductor chip is picked up by a relay arm from a wafer mounted on a wafer stage, so as to be transferred to a relay stage. In this case, the XY stage 18 transfers the relay stage to directly below the mounting tool 20, and the mounting tool 20 picks up the semiconductor chip from the relay stage located directly therebelow.

If the semiconductor chip is picked up by the mounting tool 20, the substrate 110 is then transferred to directly below the mounting tool 20 by the XY stage 18. In this state, the mounting tool 20 is lowered toward the substrate 110, and the semiconductor chip 100 suctioned and held at an end of the mounting tool 20 is crimped and bonded onto the substrate 110.

The mounting tool 20 suctions and holds the semiconductor chip 100 and heats the semiconductor chip 100. Hence, the mounting tool 20 is provided with a suction hole (not shown) communicated with a vacuum source, a tool heater 26 for heating the semiconductor chip 100, and the like. On the bonding head 14, in addition to the mounting tool 20, a lifting and lowering mechanism lifting and lowering the mounting tool 20 is further provided.

The lifting and lowering mechanism of this example is roughly divided into a first unit 24a and a second unit 24b. The first unit 24a moves the mounting tool 20 in a Z-axis direction (that is, vertical direction), thereby pressing the semiconductor chip 100 against the substrate 110 and applying a pressing load to the semiconductor chip 100. The first unit 24a includes a voice coil motor 30 (hereinafter abbreviated as "VCM 30"), a slide shaft 32, a leaf spring 34, and a guide member 36. The VCM 30 is a drive source of the first unit 24a. The VCM 30 includes a stator 30a fixed to a moving body 46 and a mover 30b movable in the Z-axis direction with respect to the stator 30a. The mover 30b is mechanically connected to the mounting tool 20 via the slide shaft 32. The slide shaft 32 is attached to the moving body 46 via the leaf spring 34 that can be distorted in the Z-axis direction. Further, the guide member 36 is fixed to the moving body 46. The slide shaft 32 is inserted into a through hole formed in the guide member 36, and is slidable along the through hole.

When a current is applied to the VCM 30, the mover 30*b* moves in the Z-axis direction with respect to the moving body 46. At this time, the slide shaft 32 and the mounting tool 20 fixed to the slide shaft 32 move in the Z-axis direction together with the mover 30*b* while elastically deforming the leaf spring 34. In order to detect the movement of the slide shaft 32, a linear encoder 50 is provided in the first unit 24*a*. The linear encoder 50 includes a movable part 50*a* provided in the vicinity of an upper end of the slide shaft 32 and a fixed part 50*b* whose position is fixed. The linear encoder 50 outputs a relative displacement amount between the movable part 50*a* and the fixed part 50*b*. The linear encoder 50 may be a magnetic encoder magnetically detecting a displacement or an optical encoder optically detecting a displacement. In the case of the optical encoder, the fixed part 50*b* includes a scale in which multiple slit holes are formed in a displacement direction, and the movable part 50*a* includes a light source and a light receiving element arranged on both sides of the scale to sandwich the scale. In the case of the magnetic encoder, the fixed part 50*b* includes a magnetic scale, and the movable part 50*a* includes a magnetic sensor. A value detected by the linear encoder 50 is output to the controller 16.

The second unit 24*b* lifts and lowers the first unit 24*a* in the Z-axis direction with respect to a base member 38. The second unit 24*b* includes a lifting and lowering motor 40 as a drive source. An axially extending leadscrew 42 is connected to the lifting and lowering motor 40 via a coupling. With driving of the lifting and lowering motor 40, the leadscrew 42 rotates on its axis. A moving block 44 is screwed to the leadscrew 42. The moving block 44 is fixed to an upper surface of the stator 30*a* of the VCM 30. The moving body 46 is fixed to a side surface of the stator 30*a*. The moving body 46 is slidable along a guide rail 48 fixed to the base member 38. When a current is applied to the lifting and lowering motor 40, the leadscrew 42 rotates on its axis, and accordingly, the moving block 44 is lifted and lowered in the Z-axis direction. Then, since the moving block 44 is lifted and lowered, the first unit 24*a* and the mounting tool 20 fixed to the moving block 44 are also lifted and lowered. The amount of lifting and lowering of the first unit 24*a* by the second unit 24*b* is also detected by a sensor (for example, an encoder attached to the lifting and lowering motor 40) and sent to the controller 16.

The controller 16 controls driving of the tool heater 26, the lifting and lowering mechanism, the stage 12, and the XY stage 18. The controller 16 is physically a computer including a processor 16*a* and a memory 16*b*. The "computer" also includes a microcontroller that incorporates a computer system into one integrated circuit. The processor 16*a* refers to a processor in a broad sense, and includes a general-purpose processor (for example, a central processing unit (CPU)) or a dedicated processor (for example, a graphics processing unit (GPU), an application specific integrated circuit (ASIC), a field programmable gate array (FPGA), or a programmable logic device). An operation of the processor 16*a* described below may be achieved not only by one processor, but also by cooperation of multiple processors present in physically separated positions. Similarly, the memory 16*b* does not have to be physically one element, and may be composed of multiple memories present in physically separated positions. The memory 16*b* may include at least one of a semiconductor memory (for example, a RAM, a ROM, or a solid state drive) and a magnetic disk (for example, a hard disk drive).

Figure 2:
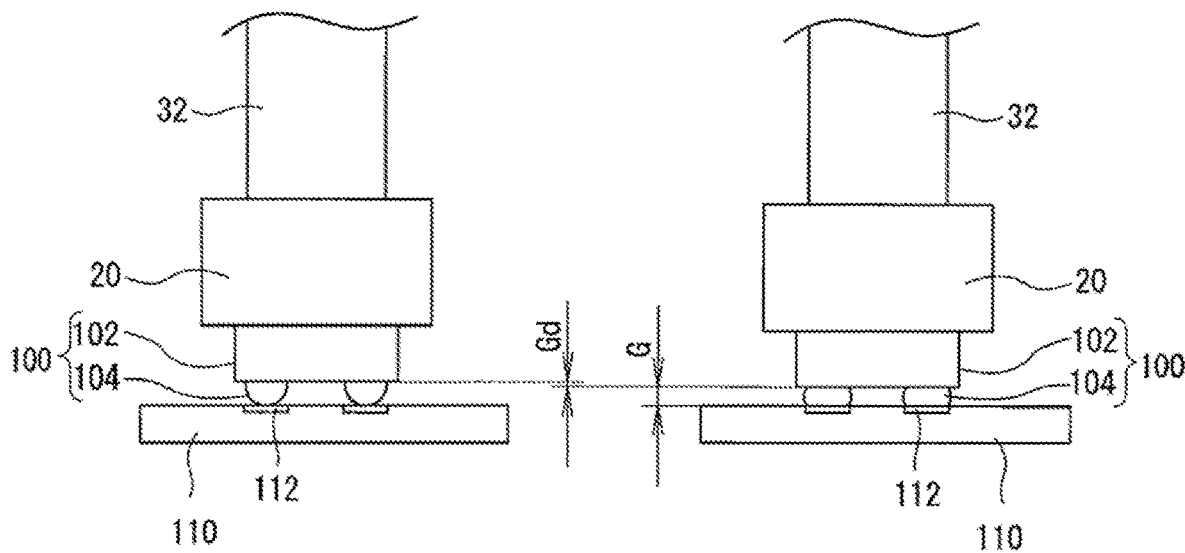
FIG. 2 is a conceptual diagram showing a state of bonding of a semiconductor chip.

Next, a bonding method of the semiconductor chip 100 by the manufacturing apparatus 10 is described. FIG. 2 is a conceptual diagram showing a state of bonding of the semiconductor chip 100. As shown in the left figure of FIG. 2, multiple electrodes 112 are formed on an upper surface of the substrate 110. The semiconductor chip 100 has multiple bumps 104 made of a conductive metal such as solder and protruding from a bottom surface of a chip body 102. When the semiconductor chip 100 is mounted, with the bump 104 in contact with the electrode 112 of the substrate 110, the semiconductor chip 100 is heated, and the bump 104 is welded to the electrode 112 as shown in the right figure of FIG. 2. Although not shown in FIG. 2, a thermosetting resin layer, such as for example a layer of a non-conductive film, may further be provided on the bottom surface of the chip body 102.

Here, in order to maintain good quality of the semiconductor device, it is necessary to prevent the bump 104 from being excessively crushed and to maintain a gap amount G between the bottom surface of the chip body 102 and the upper surface of the substrate 110 after bonding at a target value. During the bonding, if the molten bump 104 is excessively pressed and crushed and extends laterally, there is a risk of causing a short circuit failure between the molten bump 104 and another bump 104 adjacent thereto. In addition, if the gap amount G varies, the quality of the semiconductor device cannot be appropriately maintained. Hence, when bonding is performed, it is necessary to accurately manage an axial position of the semiconductor chip 100 and an axial position of a bottom surface of the mounting tool 20. However, in the case of managing the axial position of the mounting tool 20, thermal expansion and contraction and distortion have become problems. This is described with reference to FIG. 3 and FIG. 4.

Figure 3:
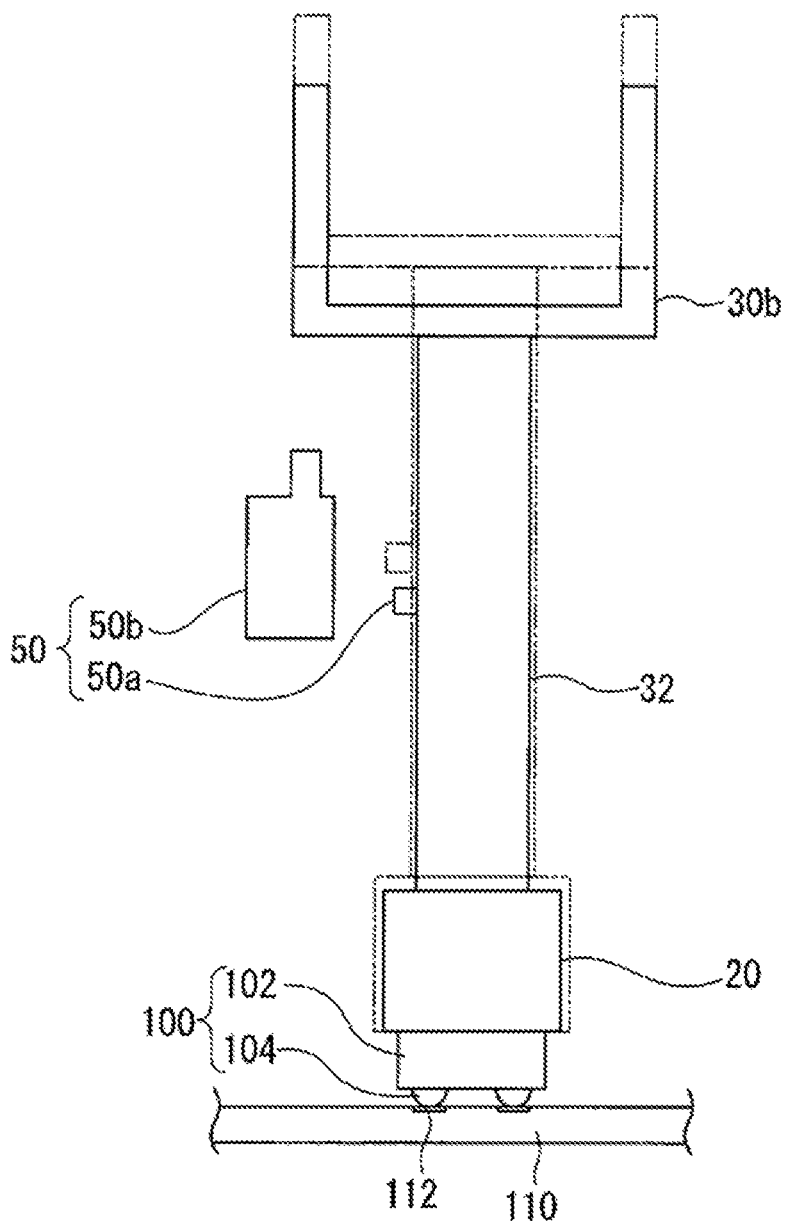
FIG. 3 is a diagram showing a state in which a bonding head is thermally expanded.
Figure 4:
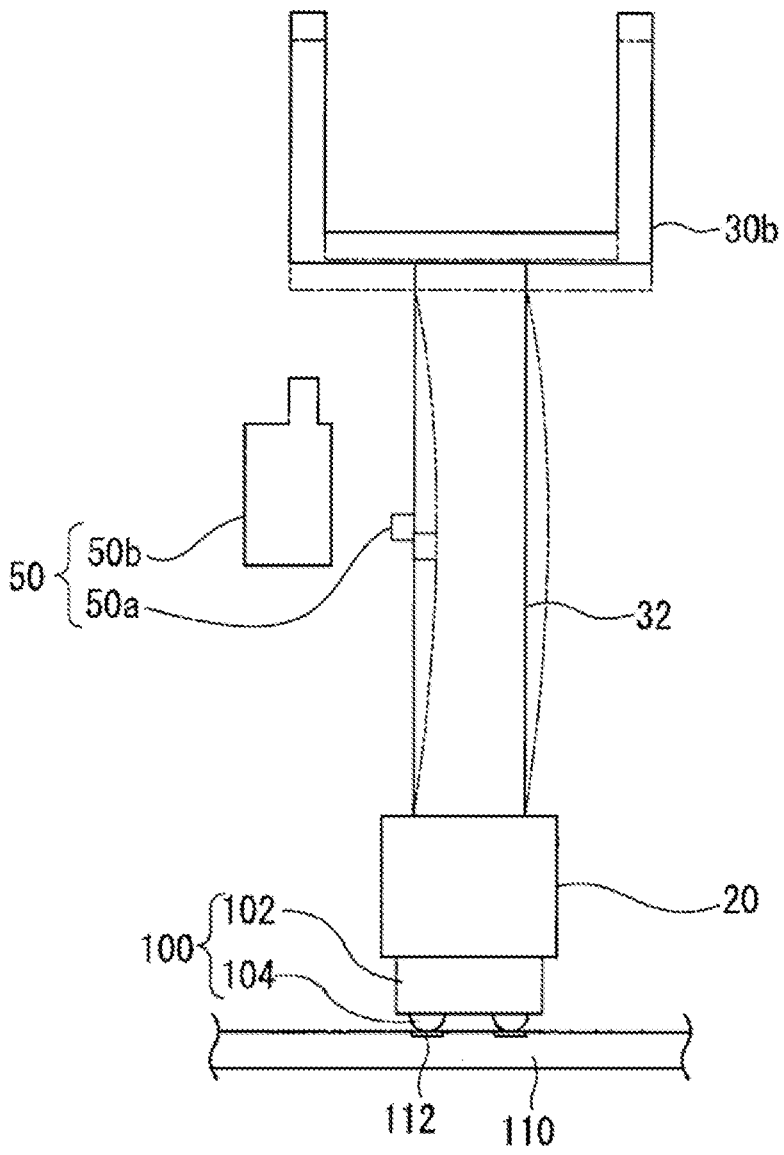
FIG. 4 is a diagram showing a state in which a bonding head is distorted.

As described above, when the semiconductor chip 100 is bonded, the semiconductor chip 100 is heated by the tool heater 26 provided on the mounting tool 20. Due to the heat generated during the heating, members around the tool heater 26, specifically, the mounting tool 20, the slide shaft 32 and the like (hereinafter referred to as "peripheral member"), are thermally expanded and contracted. The chain double-dashed line in FIG. 3 illustrates how the peripheral members are thermally expanded and contracted. When the peripheral members are thermally expanded, even if no change occurs in the axial position of the bottom surface of the mounting tool 20, the axial position of the movable part 50*a* of the linear encoder 50 changes. Hence, in the case where thermal expansion and contraction occur, the actual position of the semiconductor chip 100 cannot be accurately grasped from a detected position Pd detected by the linear encoder 50 or the like, and the gap amount G cannot be accurately managed.

When the semiconductor chip 100 is bonded, the mounting tool 20 applies a specified standard load Fs to the semiconductor chip 100 and presses the semiconductor chip 100 against the substrate 110. At this time, a predetermined reaction force acts on the mounting tool 20 from the semiconductor chip 100. In response to this reaction force, the slide shaft 32 may be distorted as indicated by the chain double-dashed line in FIG. 4. When the slide shaft 32 is distorted, it is natural that the axial position of the movable part 50*a* of the linear encoder 50 changes accordingly. Also, in this case, the actual position of the semiconductor chip 100 cannot be accurately grasped from the detected position Pd detected by the linear encoder 50 or the like, and the gap amount G cannot be accurately managed.

In the case where the bump 104 continues to be heated and pressurized while the slide shaft 32 is distorted, the reaction force from the semiconductor chip 100 sharply decreases at the moment when the bump 104 is melted. In this case, distortion of the slide shaft 32 is instantly eliminated, and the bottom surface of the mounting tool 20 sharply drops. In this case, the molten bump 104 is pushed by the mounting tool 20, and there is a risk that the bump 104 may be excessively pressed and crushed.

Figure 5:
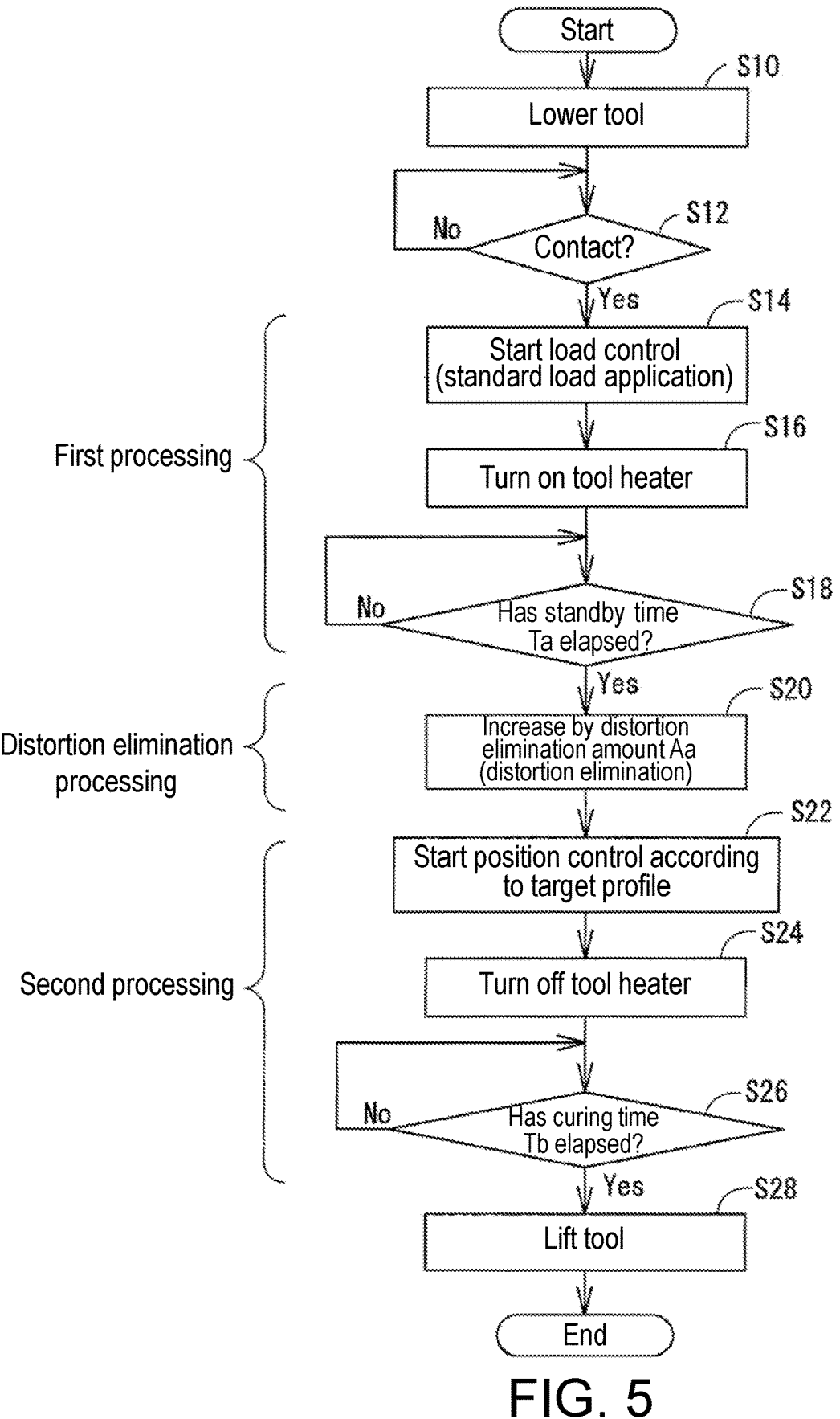
FIG. 5 is a flowchart showing a flow of bonding processing.
Figure 6:
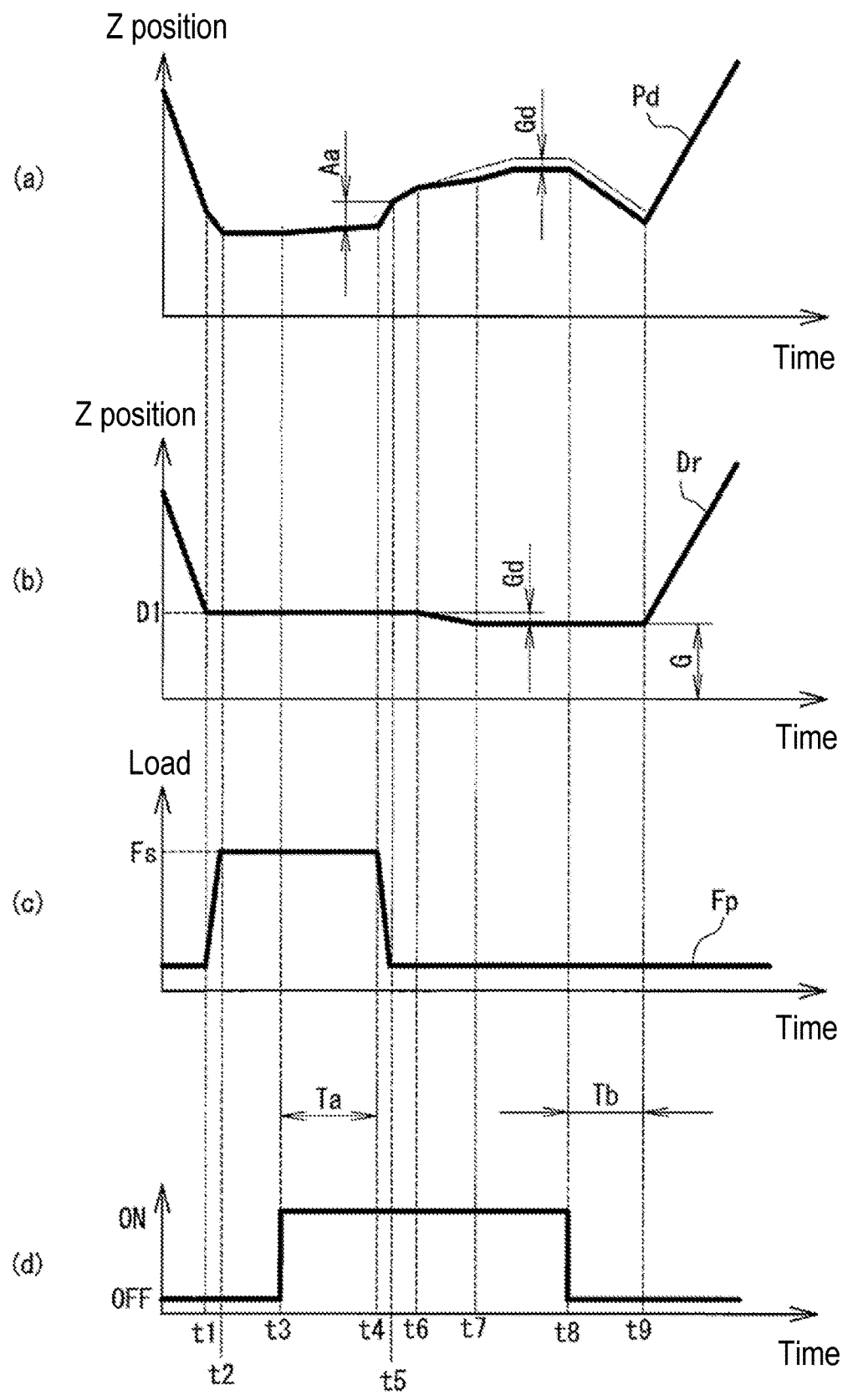
FIG. 6 includes graphs showing temporal changes of various parameters in the bonding processing.

In this example, in order to avoid such a problem, before melting of the bump 104, the lifting and lowering mechanism is driven in the lifting direction and distortion of the slide shaft 32 is eliminated. In addition, position control is performed on the mounting tool 20 so as to cancel thermal expansion and contraction of the peripheral members, thereby maintaining the gap amount G at a predetermined target value. A detailed procedure of such bonding is hereinafter described with reference to FIG. 5 and FIG. 6. FIG. 5 is a flowchart showing a flow of the bonding processing. FIG. 6 includes graphs showing temporal changes of various parameters in the bonding processing. (*a*) of FIG. 6 is a graph showing the axial position (hereinafter referred to as "detected position Pd") of the mounting tool 20 that is obtained from a detected value from a position sensor (such as the linear encoder 50) provided in the lifting and lowering mechanism. (*b*) of FIG. 6 is a graph showing an actual distance (hereinafter referred to as "distance Dr") to the bottom surface of the mounting tool 20 with reference to the upper surface of the stage 12 in the case where the mounting tool 20 holds the semiconductor chip 100. (*c*) of FIG. 6 is a graph showing a change in a pressing load Fp applied to the semiconductor chip 100 by the lifting and lowering mechanism. (*d*) of FIG. 6 is a graph showing a driving state of the tool heater 26. In the distance Dr, a reference position of the distance changes due to distortion or thermal expansion of the stage 12.

When the semiconductor chip 100 is bonded to the substrate 110, the controller 16 drives the lifting and lowering mechanism to lower the semiconductor chip 100 and bring the semiconductor chip 100 into contact with the substrate 110 (S10, S12). Specifically, the controller 16 first drives the lifting and lowering motor 40 to lower the mounting tool 20 to the vicinity of the substrate 110 at high speed. Subsequently, while the lifting and lowering motor 40 is stopped, the VCM 30 is driven to lower the mounting tool 20 at low speed. At this time, a change in the detected position Pd is monitored. If the detected position Pd does not change any more, it is determined that contact is achieved. As described above, since the slide shaft 32 or the like is slightly distorted, there is a slight error between an actual contact timing and a contact timing detected by the controller 16.

In the example of FIG. 6, the semiconductor chip 100 actually contacts the substrate 110 at time t1, and the distance Dr does not change any more after time t1. However, after the semiconductor chip 100 actually contacts the substrate 110, the detected position Pd still changes due to distortion of the slide shaft 32 or the like. Hence, the controller 16 determines that the contact occurs at time t2 when the slide shaft 32 or the like is sufficiently distorted and the detected position Pd does not change any more.

If contact is detected (Yes in S12), the controller 16 executes first processing (S14 to S18) in which the semiconductor chip 100 is pressurized with a constant load and heated. Specifically, the controller 16 starts load control of the lifting and lowering mechanism so that the previously specified standard load Fs is applied to the semiconductor chip 100 (S14). That is, since the VCM 30 outputs a torque proportional to an applied current, the controller 16 continues to apply to the VCM 30 a constant current corresponding to the standard load Fs. In FIG. 6, the standard load Fs is applied to the semiconductor chip 100 during a period from time t2 to time t4.

If the standard load Fs is applied, the controller 16 subsequently turns ON the tool heater 26 and starts heating of the semiconductor chip 100 (S16). In the example of FIG. 6, the tool heater 26 is turned ON at time t4. Accordingly, the temperature of the semiconductor chip 100 begins to rise.

The controller 16 monitors whether an elapsed time from start of heating has reached a standby time Ta (S18). Here, the standby time Ta is time obtained by subtracting a slight margin a from time (hereinafter referred to as "melting time Tm") from start of heating until melting of the bump 104. That is, Ta=Tm−α. From another point of view, it can be said that a timing at which the standby time Ta has elapsed is immediately before melting of the bump 104. The standby time Ta and the melting time Tm are obtained in advance by an experiment, which will be described later. If the standby time Ta has elapsed from start of heating (Yes in S18), the controller 16 determines that the bump 104 is in a state immediately before melting. In the example of FIG. 6, time t4 is a timing at which the standby time Ta has elapsed and the bump 104 is in the state immediately before melting.

If the state immediately before melting is achieved, the controller 16 executes distortion elimination processing (S20) for eliminating distortion of the bonding head 14. Specifically, the controller 16 lifts the VCM 30 in a direction of lifting the mounting tool 20 by a specified distortion elimination amount Aa (S20). Here, the distortion elimination amount Aa is a movement amount of the VCM 30 required to eliminate distortion occurring in the lifting and lowering mechanism when the semiconductor chip 100 is pressurized with the standard load Fs. Similarly to the standby time Ta and the melting time Tm, the distortion elimination amount Aa is obtained in advance by an experiment, which will also be described later. In any case, by driving the VCM 30 in the lifting direction by the distortion elimination amount Aa, distortion of the bonding head 14 (particularly the slide shaft 32) is eliminated. In the example of FIG. 6, the VCM 30 is driven during a period from time t4 to time t5 until the detected position Pd rises by the distortion elimination amount Aa. At this time, the distance Dr of the mounting tool 20 does not change, distortion of the slide shaft 32 is eliminated, and the pressing load Fp sharply decreases.

If distortion can be eliminated, the controller 16 executes second processing (S22 to S26) for maintaining the gap amount G at the target value. Specifically, the controller 16 starts position control of the VCM 30 according to a previously generated target profile (S22). The target profile is a movement profile that specifies a target movement position of the lifting and lowering mechanism. The controller 16 performs position feedback control on the VCM 30 so that a difference between a command position obtained from the target profile and the detected position Pd approaches zero. Here, as described above, the detected position Pd is affected by thermal expansion and contraction of the mounting tool 20 and the stage 12, and a deviation occurs between the detected position Pd and the distance Dr between the upper surface of the stage 12 and the bottom surface of the mounting tool 20. That is, due to thermal expansion of the stage 12 and the mounting tool 20, the controller 16 may detect, as the detected position Pd, a position different from the distance Dr from a height D1 of the stage 12 after distortion is eliminated. The target profile is set so that an error caused by this thermal expansion and contraction is canceled and the actual gap amount G is maintained at the target value.

This is specifically described with reference to FIG. 6. In the case where the distance Dr of the mounting tool 20 is maintained constant based on the height D1 after distortion is eliminated, the detected position Pd is affected by thermal expansion and contraction of the mounting tool 20 and thus changes as indicated by the chain double-dashed line in (*a*) of FIG. 6. That is, the detected position Pd in the case where Dr=D1 is maintained gradually rises after time t3 when the tool heater 26 is turned ON, and gradually drops after time t8 when the tool heater 26 is turned OFF. On the other hand, in order to set the gap amount G to the target value, it is necessary to further reduce the distance Dr from the height D1 by a target crushing amount Gd. In order to realize such a change of the distance Dr, position control may be performed on the lifting and lowering mechanism by using a position obtained by subtracting the target crushing amount Gd from the position indicated by the chain double-dashed line as the command position.

The target profile used in step S22 is a profile showing the position obtained by subtracting the target crushing amount Gd from the position indicated by the chain double-dashed line. By performing position control on the VCM 30 according to the target profile, the distance Dr can be maintained constant and the gap amount G can be maintained at the target value. Such a target profile is generated prior to bonding, which will also be described later.

The controller 16 turns OFF the tool heater 26 according to a preset temperature profile (S24). Accordingly, the temperature of the bump 104 that was once melted sharply falls and the bump 104 is cured. In the example of FIG. 6, the tool heater 26 is turned OFF at time t8. Accordingly, the bump 104 is cured. By turning OFF the tool heater 26, the temperature of the lifting and lowering mechanism (particularly the slide shaft 32) also falls, and thermal expansion and contraction of the lifting and lowering mechanism is eliminated. After or at the same time as when the temperature falls, the mounting tool 20 is lowered according to the target profile.

Then, if a predetermined curing time Tb has elapsed after when the tool heater 26 is turned OFF (Yes in S26), the controller 16 determines that the bump 104 is cured. The curing time Tb is specified in advance based on a prior experiment, past experience or the like. If the curing time Tb has elapsed, the controller 16 lifts the mounting tool 20 after releasing the semiconductor chip 100 held by the mounting tool 20 (S28). Accordingly, the bonding processing of one semiconductor chip 100 is ended. After that, the same processing is repeated on other semiconductor chips 100.

As is clear from the above description, in this example, by driving the VCM 30 in the lifting direction immediately before melting of the bump 104, distortion of the bonding head 14 is eliminated. As a result, it can be effectively prevented that when the bump 104 is melted, the mounting tool 20 moves excessively downward and excessively presses and crushes the bump 104.

In this example, a timing (that is, the melting time Tm) at which the bump 104 is melted is acquired in advance, and the load control is switched to the position control before melting of the bump 104. By such a configuration, the bump 104 can be prevented from being excessively pressed and crushed. That is, in many conventional techniques, load control is performed in which a constant load is applied to the semiconductor chip 100. At that time, if the detected position Pd drops by a certain amount or more, it is determined that the bump 104 is melted. In the case of such a technique, at the moment when the bump 104 is melted, the mounting tool 20 is greatly lowered and the gap amount G becomes smaller than the target value. For example, in Patent Document 1, at the moment when the bump 104 is melted, the gap amount G becomes smaller than the target value. Hence, in Patent Document 1, after the gap amount G becomes smaller than the target value, by lifting the mounting tool, the gap amount G is corrected to the target value. However, as in Patent Document 1, if the bump 104 is greatly pressed and crushed, the laterally extending bump 104 contacts the bump 104 adjacent thereto; even if temporary, there is a risk of causing a short circuit failure. On the other hand, as in this example, by switching to position control immediately before melting of the bump 104, excessive crushing of the bump 104 is reduced, and a short circuit failure can be effectively prevented.

Next, acquisition of the distortion elimination amount Aa, the standby time Ta, and the target profile used in such bonding processing is described. Before starting the manufacture of the semiconductor device, the manufacturing apparatus 10 performs distortion elimination amount detection processing, melting timing detection processing, and target profile generation processing. Hereinafter, these processings are described.

Figure 7:
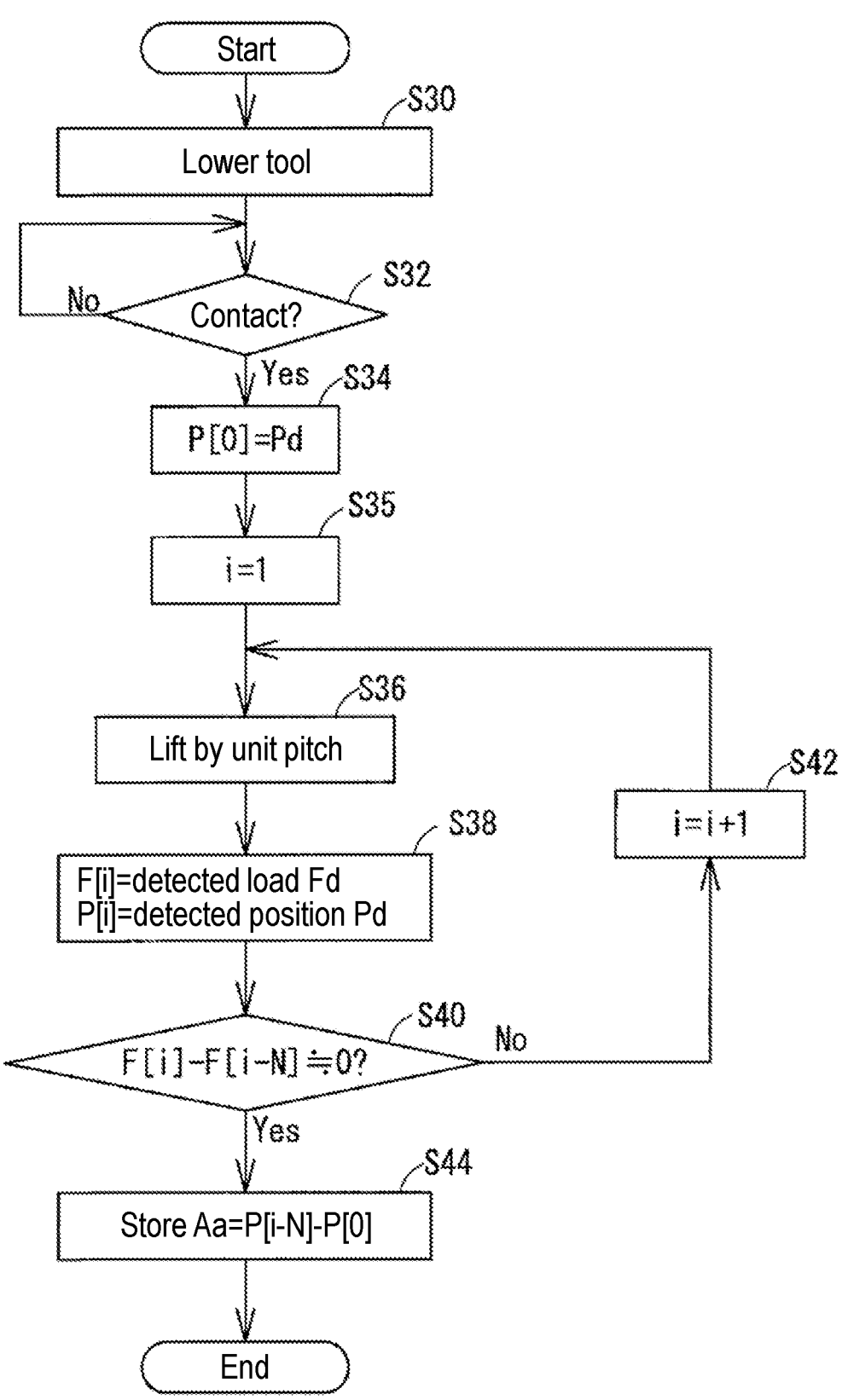
FIG. 7 is a flowchart showing a flow of distortion elimination amount detection processing.
Figure 8:
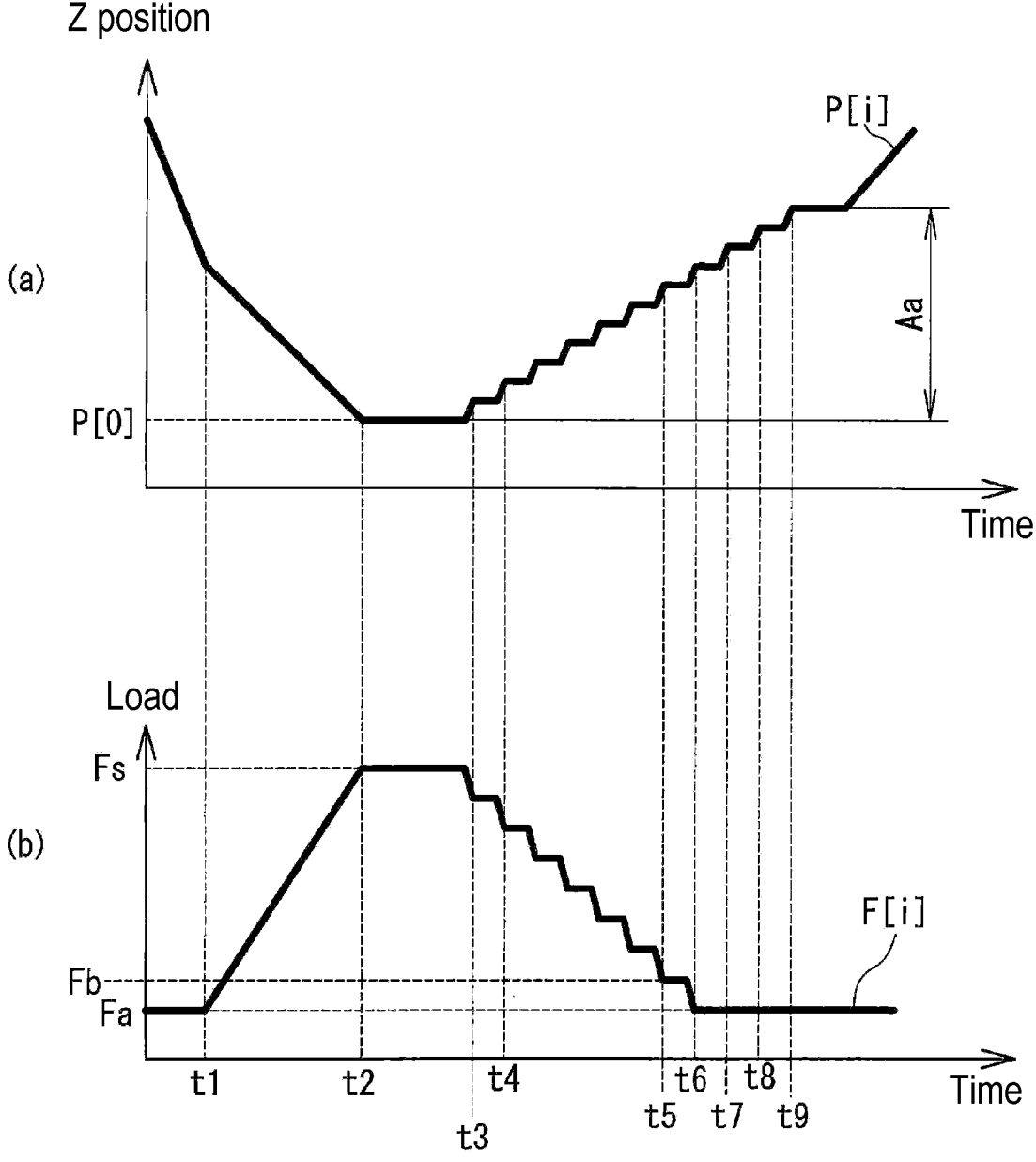
FIG. 8 includes graphs showing temporal changes of various parameters in the distortion elimination amount detection processing.

First of all, the distortion elimination amount detection processing is described with reference to FIG. 7 and FIG. 8. As described above, in the bonding processing, immediately before melting of the bump 104, the VCM 30 is driven in the lifting direction by the distortion elimination amount Aa. Accordingly, distortion of the bonding head 14 (particularly the mounting tool 20 and the slide shaft 32) is eliminated. The distortion elimination amount Aa used at this time is detected by the distortion elimination amount detection processing performed prior to the bonding processing. FIG. 7 is a flowchart showing a flow of the distortion elimination amount detection processing. FIG. 8 includes graphs showing changes in the detected position Pd and a detected load Fd in the distortion elimination amount detection processing.

When the distortion elimination amount detection processing is performed, the mounting tool 20 is used while not holding the semiconductor chip 100. A load sensor (for example, a load cell) is disposed in advance on the bottom surface of the mounting tool 20 or the upper surface of the substrate 110, so as to be able to detect the pressing load on the substrate 110 by the mounting tool 20 as the detected load Fd in advance. Further, the mounting tool 20 and the substrate 110 are set at the same predetermined temperature as each other in advance. If such preparations are ready, the controller 16 drives the lifting and lowering mechanism to lower the mounting tool 20 that does not hold the semiconductor chip 100 until the mounting tool 20 contacts the substrate 110 (S30, S32). In the example of FIG. 8, it is determined that contact is achieved at time t2 when the detected position Pd stops fluctuating. At this time, a current applied to the VCM 30 is adjusted so that the mounting tool 20 presses the substrate 110 with the standard load Fs. The predetermined temperature is, for example, room temperature (20° C.). However, the mounting tool and the stage may be heated by a heater to 50° C. or 100° C. In this example, the distortion elimination amount Aa detected by the distortion elimination amount detection processing is defined as a lifting amount of the VCM 30 in the distortion elimination processing. However, the lifting amount of the VCM 30 in the distortion elimination processing may be a value obtained by performing some correction on the distortion elimination amount Aa.

If the mounting tool 20 contacts the substrate 110, the controller 16 stores the detected position Pd at that moment as P[0] in the memory (S34). In the example of FIG. 8, the detected position Pd at time t2 is stored as P[0]. Subsequently, the controller 16 initializes a parameter i and sets i=1 (S35). After that, the controller 16 drives the VCM 30 in the lifting direction by a predetermined unit pitch (S36). That is, the VCM 30 is driven until the detected position Pd detected by the linear encoder 50 changes by an amount corresponding to the unit pitch. Although the value of the unit pitch is not particularly limited, it is set as a value sufficiently smaller than a detection error caused by distortion of the slide shaft 32. In the example of FIG. 8, the first lifting driving corresponding to the unit pitch is completed at time t3. By driving the VCM 30 in the lifting direction, the pressing load is slightly reduced, and accordingly, distortion of the slide shaft 32 or the like is also slightly eliminated.

If the driving in the lifting direction corresponding to the unit pitch is completed, the controller 16 stores the detected load Fd and the detected position Pd at that moment as F[i] and P[i] respectively in the memory (S38). Subsequently, the controller 16 compares the current detected load F[i] with an Nth previous detected load F[i−N] (S40). N is an integer of 1 or more. As a result of comparison, if F[i]≈F[i−N] is not satisfied (No in S40), it can be determined that the detected load Fd has changed due to an increase in the unit pitch. In this case, the controller 16 proceeds to step S42 and increments the parameter i, and then executes steps S38 and S40 again. Although not described in the flowchart, if i<N and the Nth previous detected load F[i−N] does not exist, the process still proceeds to step S42.

On the other hand, if F[i]≈F[i−N] is satisfied (Yes in S40), that is, if the detected load Fd does not fluctuate any more even if the VCM 30 is driven in the lifting direction, P[i−N]−P[0] is stored as the distortion elimination amount Aa in the memory (S44). P[i−N]−P[0] is a movement amount of the lifting and lowering mechanism from start of driving of the VCM 30 in the lifting direction until stop of fluctuation of the detected load Fd.

Assuming that N=3 with reference to the example of FIG. 8, since F[i] is Fa and F[i−3] is Fb at the moment of time t8, F[i]≠F[i−N]. Therefore, in this case, the controller 16 does not proceed to step S44 and proceeds to step S42. Subsequently, at time t9, since F[i]=Fa and F[i−3]=Fa, F[i]≈F[i−N] is satisfied. In this case, the controller 16 proceeds to step S44. Here, at time t9, P[i−3] is the detected position Pd at time t6, and P[0] is the detected position Pd at time t2. Therefore, in this case, the distortion elimination amount Aa is as shown in FIG. 8. In this way, by acquiring the distortion elimination amount Aa in advance by an experiment, distortion of the lifting and lowering mechanism can be relatively reliably eliminated in the bonding processing.

Figure 9:
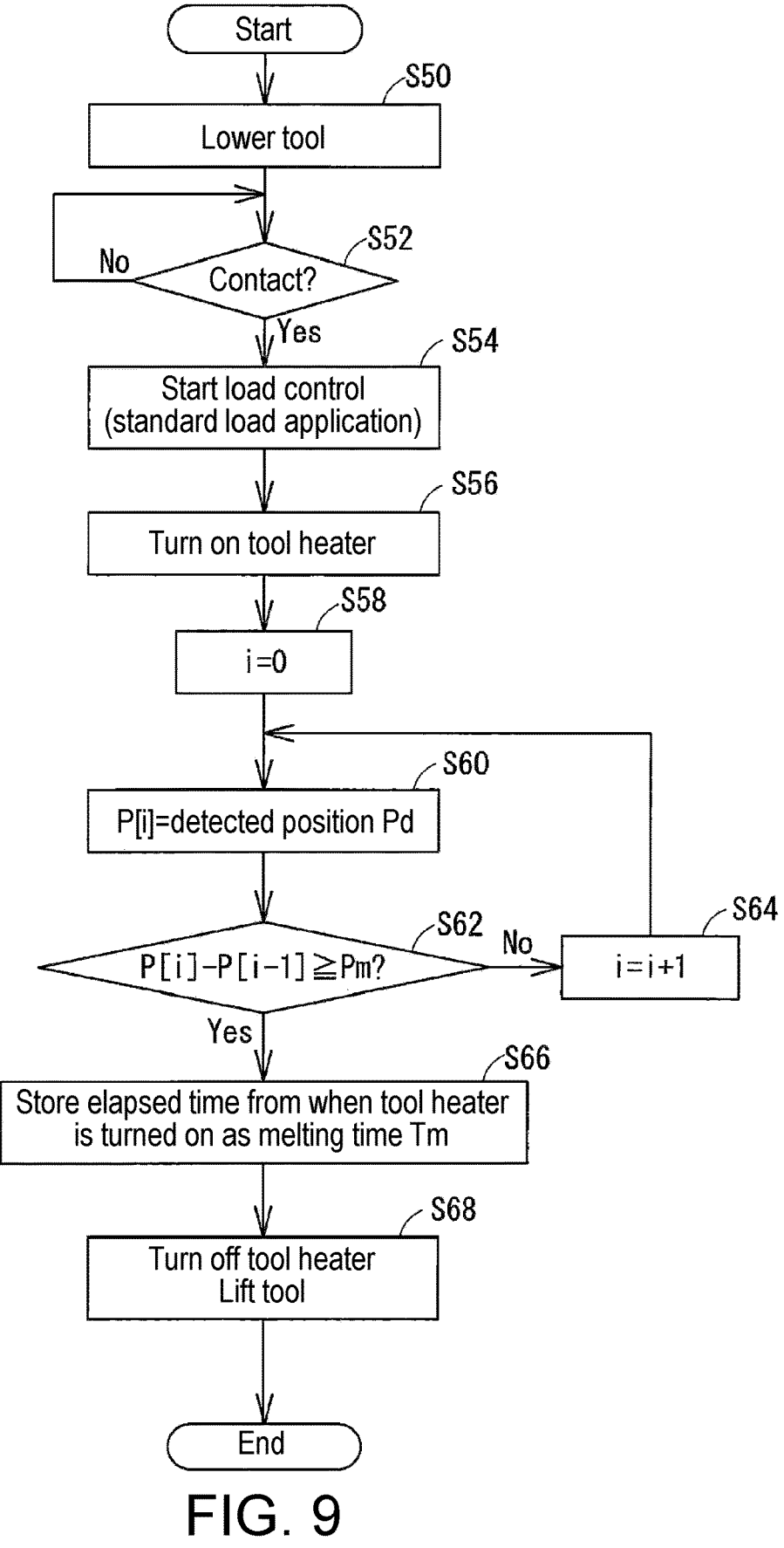
FIG. 9 is a flowchart showing a flow of melting timing detection processing.
Figure 10:
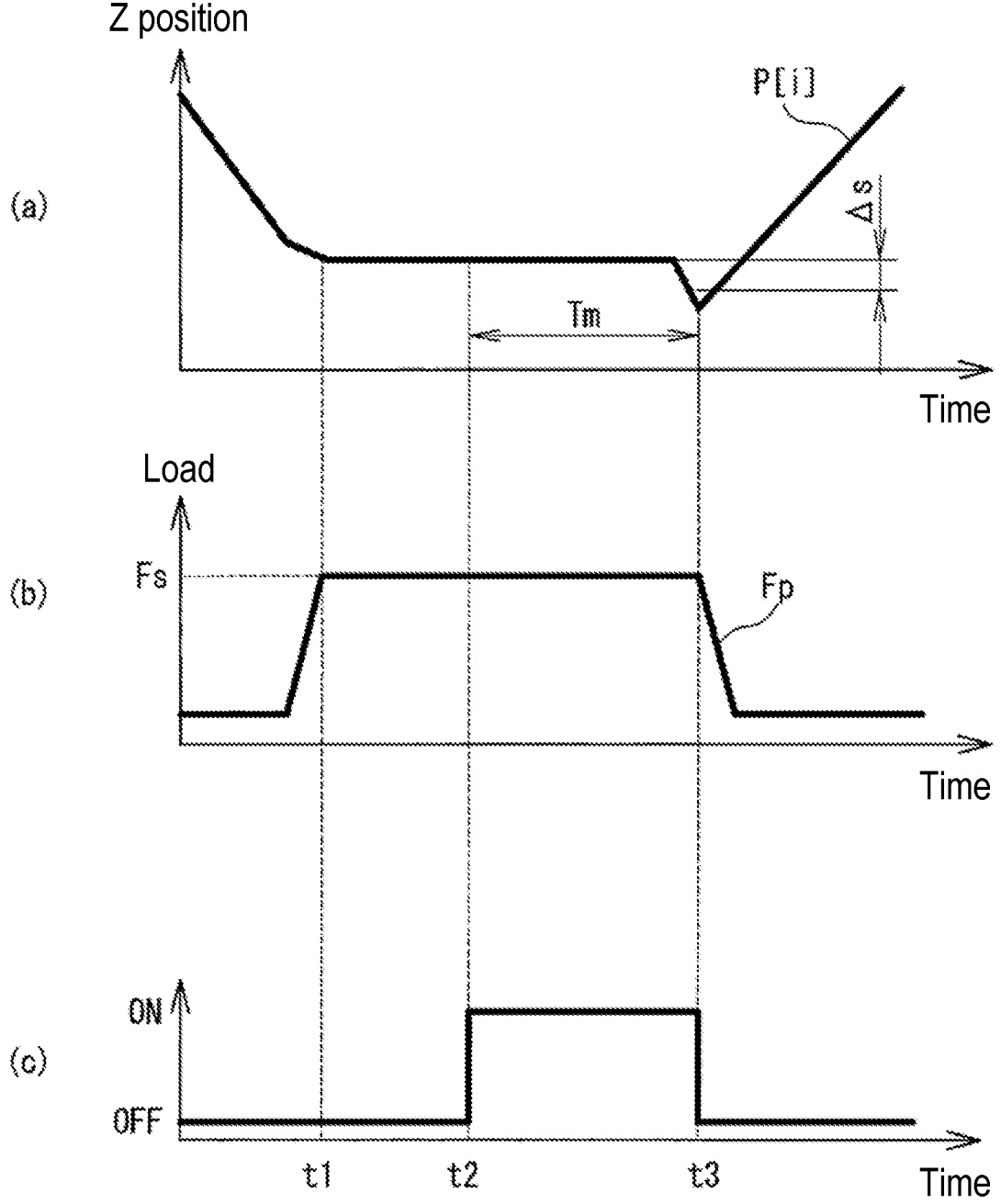
FIG. 10 includes graphs showing temporal changes of various parameters in the melting timing detection processing.

Next, the melting timing detection processing is described with reference to FIG. 9 and FIG. 10. As described above, in the bonding processing, the distortion elimination processing is executed immediately before melting of the bump 104. In order to execute the distortion elimination processing at such a timing, it is necessary to grasp in advance the timing at which the bump 104 is melted. Thus, in this example, the melting timing detection processing is performed prior to the bonding processing. FIG. 9 is a flowchart showing a flow of the melting timing detection processing. FIG. 10 includes graphs showing the detected position Pd, the pressing load, and the driving state of the tool heater 26 in the melting timing detection processing.

When the melting timing detection processing is performed, the semiconductor chip 100 is held in advance by the mounting tool 20. The controller 16 drives the lifting and lowering mechanism to lower the mounting tool 20 until the mounting tool 20 contacts the substrate 110 (S50, S52). If the semiconductor chip 100 contacts the substrate 110 (Yes in S52), the controller 16 starts load control of the lifting and lowering mechanism so that the previously specified standard load Fs is applied to the semiconductor chip 100 (S54), and turns ON the tool heater 26 (S56). In the example of FIG. 10, at time t1, contact is detected, and a constant load is then applied to the semiconductor chip 100. Further, at time t2, the tool heater 26 is turned ON.

If the tool heater 26 is ON, the controller 16 monitors fluctuation of the detected position Pd detected by the linear encoder 50. In the case where the detected position Pd drops by a predetermined reference displacement amount As or more, it is determined that the bump 104 is melted. Specifically, the controller 16 initializes the parameter i and sets i=0 (S58). Subsequently, the current detected position Pd is stored as P[i] in the memory (S60). Further, the controller 16 compares a difference value between the current detected position P[i] and a previous detected position P[i−1] with the previously specified reference displacement amount Δs (S62). As a result of comparison, if P[i]−P[i−1]<Δs (No in S62), the controller 16 proceeds to step S64 and increments the parameter i, and then performs steps S60 and S62 again. Although not described in the flowchart, if i=0 and P[i−1] does not exist, the process still does not proceed to step S66 and proceeds to step S64.

On the other hand, if P[i]−P[i−1]≥Δs (Yes in S62), it can be determined that the bump 104 is melted. In this case, the controller 16 stores an elapsed time from when the tool heater 26 is turned ON as the melting time Tm in the memory (S66). In the example of FIG. 10, since the detected position Pd sharply drops at time t3, it can be determined that the bump 104 is melted at time t3. In this case, time from time t2 to time t3 is stored as the melting time Tm in the memory. If the melting time Tm can be acquired, the controller 16 turns OFF the tool heater 26 and lifts the mounting tool 20 (S68). Accordingly, the melting timing detection processing is ended.

When the bonding processing is performed, a value obtained by subtracting the slight margin a from the melting time Tm is used as the standby time Ta. In this way, prior to the bonding processing, by detecting the melting timing of the bump 104 in advance by an experiment, the distortion elimination processing can be performed immediately before melting of the bump 104. As a result, it can be prevented that the mounting tool 20 is instantly greatly lowered when the bump 104 is melted. As a result, the bump 104 can be prevented from being excessively crushed.

Figure 11:
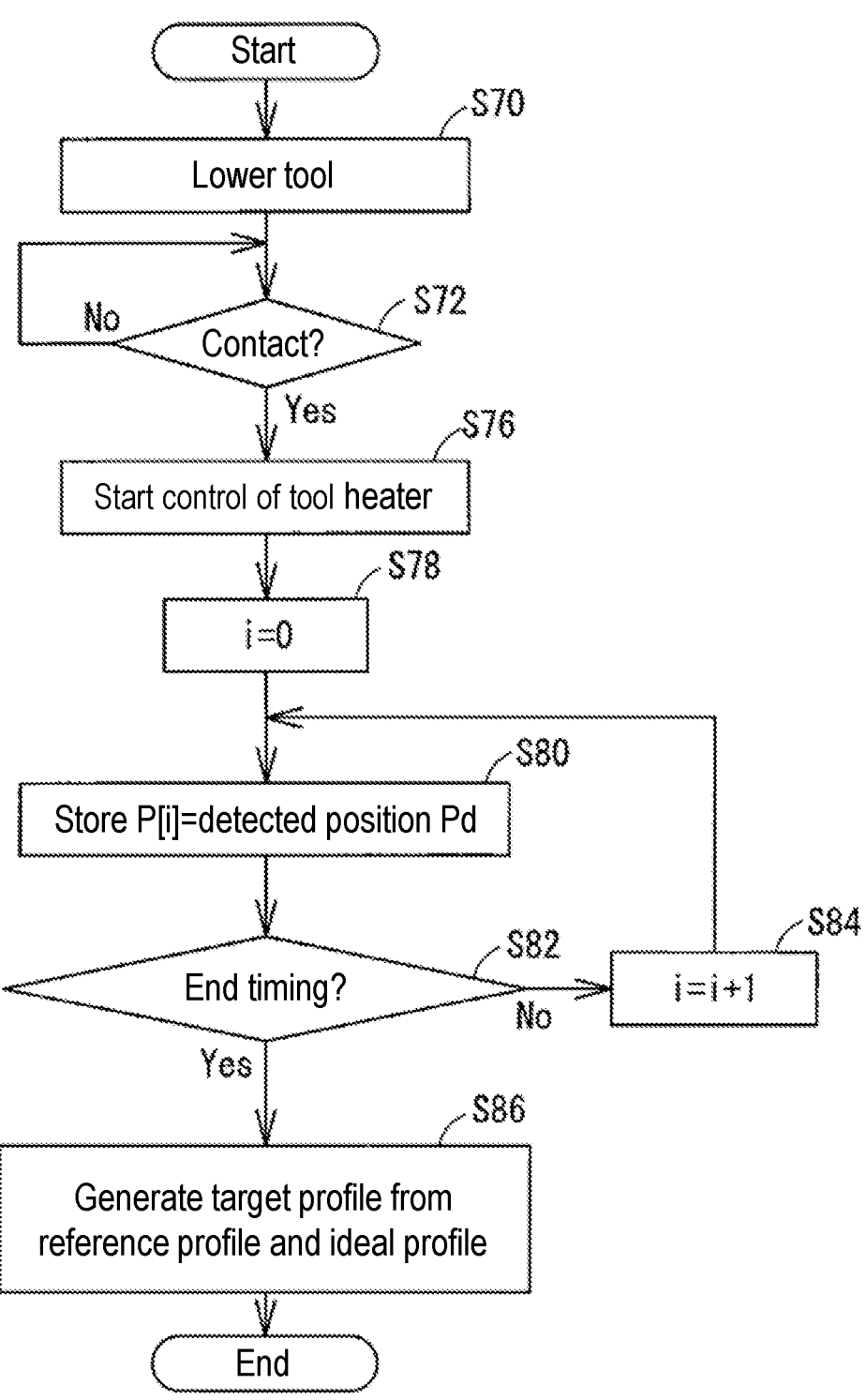
FIG. 11 is a flowchart showing a flow of target profile generation processing.
Figure 12:
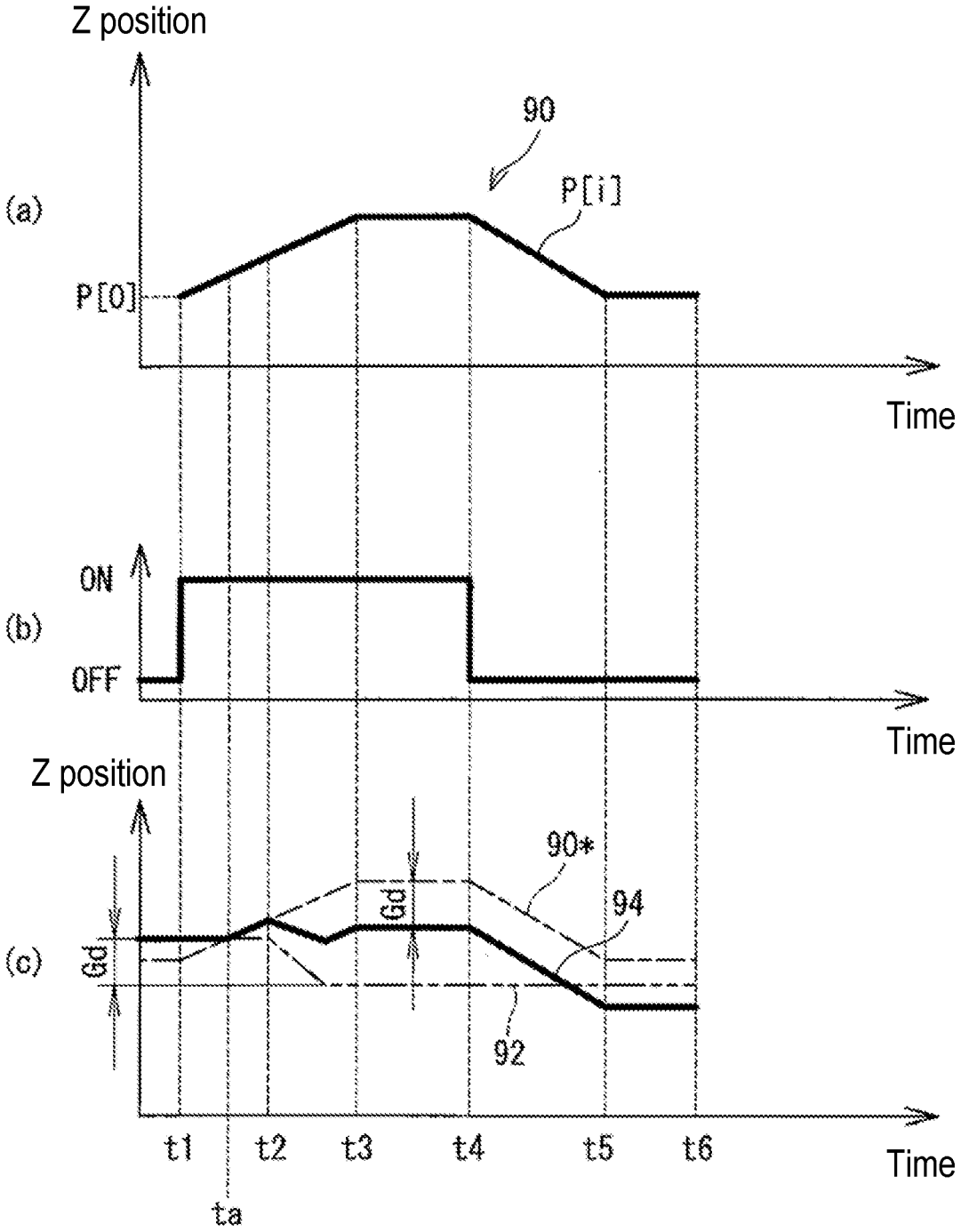
FIG. 12 includes graphs showing temporal changes of various parameters in the target profile generation processing.

Next, the target profile generation processing is described with reference to FIG. 11 and FIG. 12. As described above, in the bonding processing, after the bump 104 is melted, the gap amount G is maintained at the specified target value by performing position control on the lifting and lowering mechanism so as to cancel thermal expansion and contraction of the bonding head 14. In the target profile generation processing, the target profile used in this position control is generated. FIG. 11 is a flowchart showing a flow of the target profile generation processing. FIG. 12 illustrates changes of various parameters in the target profile generation processing. More specifically, (a) of FIG. 12 is a graph showing a reference profile 90 acquired by the target profile generation processing, and (b) of FIG. 12 is a graph showing the driving state of the tool heater 26 in the target profile generation processing. (c) of FIG. 12 is a graph showing an offset processed reference profile 90*, an ideal profile 92, and a target profile 94.

When the target profile generation processing is performed, the mounting tool 20 is in a state of not holding the semiconductor chip 100. The controller 16 drives the lifting and lowering mechanism to lower the mounting tool 20 that does not hold the semiconductor chip 100 until the mounting tool 20 contacts the substrate 110 (S70, S72). If the mounting tool 20 contacts the substrate 110, the controller 16 starts control of the tool heater 26 (S76). The control of the tool heater 26 is performed according to the same temperature profile as the bonding processing. That is, in the bonding processing, a timing to turn ON or a timing to turn OFF the tool heater 26 is specified in advance, and such a timing is stored as a temperature profile in the memory of the controller 16. In step S76, the control of the tool heater 26 according to this temperature profile is started. The controller 16 initializes the parameter i and sets i=0 (S78). If the control of the tool heater 26 is started, the controller 16 repeats processing (S80) for storing the current detected position Pd as P in the memory and processing (S84) for incrementing the parameter i at predetermined sampling intervals, until an end timing of the bonding processing is reached (until Yes in S82).

In the example of FIG. 12, the control of the tool heater 26 is started at time t1, and the tool heater 26 is turned ON at time t1. The detected position Pd at time t1 (see the graph of (a) of FIG. 12 is stored as an initial position P[0] in the memory. By starting the temperature profile and turning on the tool heater 26, the temperature of the mounting tool 20 and the slide shaft 32 gradually rises, and the mounting tool 20 and the slide shaft 32 are thermally expanded. As a result, the detected position Pd detected by the linear encoder 50 gradually rises even though the position of the bottom surface of the mounting tool 20 has not changed. Further, at time t3 in the example of FIG. 12, thermal expansion of the slide shaft 32 or the like converges, and the detected position Pd also becomes constant. After that, at time t4, when the tool heater 26 is turned OFF in order to start cooling, the temperature of the slide shaft 32 or the like is lowered, and thermal expansion is eliminated. Hence, after time t4, the detected position Pd is gradually lowered. Then, after time t5 when the temperature of the slide shaft 32 or the like returns to a predetermined temperature, the detected position Pd is maintained at a constant value. Then, at time t6 which is the end timing, the acquisition of the detected position Pd is ended. In steps S80 to S84, data as shown in (a) of FIG. 12 is acquired as the reference profile 90. A value obtained by subtracting the value of the position P[i] at the time of the melting time Tm--the margin α (time to in FIG. 12) from the reference profile 90 is a thermal expansion amount of the bonding head 14.

If the reference profile 90 is obtained, the controller 16 generates the target profile 94 based on the previously stored ideal profile 92 and the reference profile 90 (S86). The ideal profile 92 is a movement profile in the case where the bonding head 14 is in an ideal state without occurrence of thermal expansion or distortion.

In (c) of FIG., the solid line indicates the target profile 94, the chain double-dashed line indicates the ideal profile 92, and the chain line indicates the offset processed reference profile 90* in which the position at time ta is adjusted (that is, offset processed) to the ideal profile 92. As shown in FIG. 12, in the ideal profile 92, at time t2 when the bump 104 is melted, the ideal profile 92 drops by the target crushing amount Gd. Thereafter, the same height position is maintained. Then, the ideal profile 92 rises after time t6 when the bump 104 is cured.

The target profile 94 is obtained by adding the thermal expansion amount of the bonding head 14 obtained from the reference profile 90 to the ideal profile 92. As described above, the thermal expansion amount is obtained by subtracting the value of the position P at the time of the melting time Tm-the margin α (time ta) from the reference profile 90. By adding the thermal expansion amount to the ideal profile 92, the target profile 94 as indicated by the solid line in the graph of (c) of FIG. 12 can be obtained. When the actual bonding processing is performed, position control is performed on the lifting and lowering mechanism according to the target profile 94. By using the target profile 94, even if the bonding head 14 is thermally expanded, the position of the bottom surface of the mounting tool 20 and the gap amount G can be maintained constant.

The target profile 94 is obtained by adding the thermal expansion amount of the bonding head 14 obtained from the reference profile 90 to the ideal profile 92. As described above, the thermal expansion amount is obtained by subtracting the value of the position P[i] at the time of the melting time Tm−the margin α (time ta) from the reference profile 90. By adding the thermal expansion amount to the ideal profile 92, the target profile 94 as indicated by the solid line in the graph of FIG. 12(c) can be obtained. When the actual bonding processing is performed, position control is performed on the lifting and lowering mechanism according to the target profile 94. By using the target profile 94, even if the bonding head 14 is thermally expanded, the position of the bottom surface of the mounting tool 20 and the gap amount G can be maintained constant.

As is clear from the above description, according to this example, the distortion elimination amount Aa, the melting timing, and the target profile are acquired in advance. When the actual bonding processing is performed, before melting of the bump 104, the lifting and lowering mechanism is driven in the lifting direction by the distortion elimination amount Aa and distortion of the bonding head 14 is eliminated. Then, the lifting and lowering mechanism is driven according to the target profile that cancels thermal expansion. By such a configuration, the molten bump 104 can be effectively prevented from being excessively crushed, and good quality of the semiconductor device can be maintained. The configuration described so far is one example. If the lifting and lowering mechanism is driven in the lifting direction to eliminate distortion of the bonding head 14 before melting of the bump 104, and then the lifting and lowering mechanism is driven so as to cancel thermal expansion, other configurations may be changed as appropriate. For example, in the above description, the distortion elimination amount Aa being the movement amount of the lifting and lowering mechanism in the distortion elimination processing is acquired by a prior experiment (distortion elimination amount detection processing). However, the distortion elimination amount Aa may be acquired by another means. For example, based on rigidity of the bonding head 14 or the standard load Fs applied to the semiconductor chip 100 by the first processing, a simulation may be performed so as to acquire the distortion elimination amount Aa.

The execution timing of the distortion elimination processing does not necessarily have to be immediately before melting of the bump 104 if it is before melting of the bump 104. In the above description, in the melting timing detection processing, melting of the bump 104 is determined based on a change in the detected position Pd. However, melting of the bump 104 may be determined based on other parameters such as a change in the pressing load. The lifting and lowering mechanism of this example includes the first unit 24*a* using the VCM 30 as the drive source and the second unit 24*b* using the lifting and lowering motor 40 as the drive source. However, the configuration of the lifting and lowering mechanism may be changed as appropriate if load control and position control can both be performed.

What is claimed is:

1. A manufacturing apparatus of a semiconductor device, comprising:

a stage, supporting a substrate;

a bonding head, comprising a mounting tool that holds a chip provided with a bump on a bottom surface thereof, a tool heater that is mounted on the mounting tool in order to heat the chip, and a lifting and lowering mechanism that moves the mounting tool in a vertical direction; and a controller, controlling driving of the bonding head and performing bonding processing for bonding the chip to the substrate, wherein the controller performs, in the bonding processing:

a first processing in which, after the chip is brought into contact with the substrate, the tool heater and the lifting and lowering mechanism are driven, and as heating of the chip is started, the chip is pressurized against the substrate;

a distortion elimination processing in which, after the first processing and before melting of the bump, the lifting and lowering mechanism is driven in a lifting direction, thereby eliminating distortion of the bonding head; and a second processing in which, after the distortion elimination processing, position control is performed on the lifting and lowering mechanism so as to cancel thermal expansion and contraction of the bonding head, thereby maintaining a gap amount between the bottom surface of the chip and an upper surface of the substrate at a specified target value, wherein the controller performs a distortion elimination amount detection processing prior to the bonding processing, in the distortion elimination amount detection processing, while the mounting tool and the stage are maintained at a predetermined temperature, after the lifting and lowering mechanism is driven and the substrate is pressed by the mounting tool, a pressing load on the substrate by the mounting tool is detected while the lifting and lowering mechanism is driving in the lifting direction, and a movement amount of the lifting and lowering mechanism from start of the driving in the lifting direction until stop of fluctuation of the pressing load is stored as a distortion elimination amount, in the distortion elimination processing, the lifting and lowering mechanism is driven in the lifting direction based on the distortion elimination amount, wherein the lifting and lowering mechanism comprises a slide shaft that is mechanically connected to the mounting tool, a drive source that lifts and lowers the slide shaft, and a position sensor that detects an axial position of the slide shaft as a detected position, the controller performs a target profile generation processing prior to the bonding processing, in the target profile generation processing, after the lifting and lowering mechanism is driven and the mounting tool is brought into contact with the substrate or the stage, the mounting tool is heated according to a first specified temperature profile, and based on a change in the detected position detected by the position sensor as obtained at that time, a thermal expansion amount of the bonding head is acquired, and a movement profile in which the thermal expansion amount is canceled is generated as a target profile, in the second processing, position control is performed on the lifting and lowering mechanism according to the target profile.

2. The manufacturing apparatus of a semiconductor device according to claim 1, wherein the controller performs a melting timing detection processing in which a melting timing of the bump is detected prior to bonding of the chip to the substrate;

in the melting timing detection processing, after the chip is brought into contact with the substrate, the chip is heated according to a second specified temperature profile, and time from start of the heating until melting of the bump is stored as a melting time;

the controller determines an execution timing of the distortion elimination processing based on the melting time.

* * * * *